US010209315B2

(12) United States Patent
Novak et al.

(10) Patent No.: US 10,209,315 B2
(45) Date of Patent: Feb. 19, 2019

(54) METHOD OF ESTIMATION OF DISCHARGE TIME DURATION DURING HIGH-RATE BATTERY DISCHARGE

(71) Applicant: Flextronics AP, LLC, San Jose, CA (US)

(72) Inventors: James P. Novak, Austin, TX (US); Robert L. Myers, Austin, TX (US); Alexei Tikhonski, Austin, TX (US)

(73) Assignee: Flextronics AP, LLC, San Jose, CA (US)

( * ) Notice: Subject to any disclaimer, the term of this patent is extended or adjusted under 35 U.S.C. 154(b) by 0 days.

(21) Appl. No.: 15/406,212

(22) Filed: Jan. 13, 2017

(65) Prior Publication Data

US 2017/0199249 A1    Jul. 13, 2017

Related U.S. Application Data

(60) Provisional application No. 62/278,292, filed on Jan. 13, 2016.

(51) Int. Cl.
G01R 31/36    (2006.01)

(52) U.S. Cl.
CPC ..... G01R 31/3651 (2013.01); G01R 31/3679 (2013.01)

(58) Field of Classification Search
CPC ............ G01R 31/3651; G01R 31/3679; G01R 31/3634; G01R 31/3606; G01R 31/36
See application file for complete search history.

(56) References Cited

U.S. PATENT DOCUMENTS

2004/0017180 A1   9/2004   Cook
2010/0049457 A1   2/2010   Mutabdzija et al.
2010/0250162 A1   9/2010   White et al.

OTHER PUBLICATIONS

Marongiu et al., Influence of Current and Temperature Variation on a LiFePO4 Battery Total Capacity, Nov. 17-20, 2013, EVS27 International Battery, Hybrid and Fuel Cell Electric Vehicle Symposium, Barcelona, Spain, 11 pp.*
Kim et al., A New Direct Current Internal Resistance and State of Charge Relationship for the Li-Ion Battery Pulse Power Estimation, Oct. 22-26, 2007, The 7th International Conference on Power Electronics, EXCO, Daegu, Korea, pp. 1173-1178.*
International Search Report and Written Opinion for International (PCT) Patent Application No. PCT/US17/13498, dated Apr. 4, 2017, 9 pages.
International Preliminary Report on Patentability for International (PCT) Patent Application No. PCT/US17/13498, dated Jul. 26, 2018, 8 pages.

* cited by examiner

*Primary Examiner* — Toan Le
(74) *Attorney, Agent, or Firm* — Sheridan Ross P.C.

(57) ABSTRACT

Embodiments of the disclosure provide systems and methods for estimating battery discharge time duration during high-rate battery discharging. Generally speaking, embodiments of the present disclosure are directed to a prediction of battery run times for short duration, high-current discharge events that are scaled in seconds rather than minutes, and which are continuously compensated for ambient temperature which can alter discharge times as a result of reaching thermal limitations before chemical capacity has actually been exhausted.

14 Claims, 6 Drawing Sheets

METHOD OF ESTIMATION OF DISCHARGE TIME DURATION DURING HIGH-RATE BATTERY DISCHARGE

CROSS REFERENCE TO RELATED APPLICATION

The present application claims the benefits of and priority, under 35 U.S.C. § 119(e), to U.S. Provisional Application Ser. No. 62/278,292 filed on Jan. 13, 2016 and entitled "Method of Estimation of Discharge Time Duration During High-Rate Battery Discharge" of which the entire disclosure is incorporated herein by reference in its entirety for all that it teaches and for all purposes.

FIELD OF THE DISCLOSURE

Embodiments of the present disclosure relate generally to methods and systems for estimating battery discharge times and more particularly to estimating battery discharge time duration during high-rate battery discharging.

BACKGROUND

Batteries, such as lithium batteries, power many consumer electronic devices. Important market differentiation metrics between available batteries are generally related to how long a battery can last in a particular application scenario. Most consumer electronics operate with low to moderate current draw, resulting in battery discharge durations that can be measured in hours. In such applications, discharge rates are typically some fraction of total battery capacity, e.g., between C/2 and C/10 where C is the battery capacity. Consumers also demand continuous and accurate prediction of the discharge duration they can expect. Therefore, Battery Management Systems (BMSs) comprised of a series of analog measurement and computer logic chips monitor the battery status, make decisions about battery operation, such as when to start and end charging, when to issue warnings to users, etc., and conduct continuous estimations of battery capacity, state of charge, and expected time durations for charge and discharge. The Smart Battery System (SBS) specification used by most BMS systems, calls for discharge duration calculations to be made and presented in terms of minutes. For low to moderate discharge rate applications, such estimates of discharge duration in minutes can be made accurately and are sufficiently granular to be useful.

There are, however, emerging applications where high power battery packs are discharged at very high rates. These applications most commonly contain rechargeable Lithium batteries used to operate electrical equipment for short durations. One example of such an application is a battery backup power supply used to maintain a computer system in the event of a power failure. In such applications, discharge rates can exceed battery capacity by a significant factor, e.g., 10 C, where C is the battery capacity. At such discharge rates, these applications will can potentially discharge the battery in a time period as short as 3 to 5 minutes. Such rapid discharging creates an extreme amount of heat. In some cases, the heat can be enough to melt the battery and cause a catastrophic failure, e.g., a fire and/or explosion. Therefore, most BMS include a thermal safety feature that monitors battery temperature and shuts off or interrupts discharging when the battery heats to a certain temperature. While these thermal safety features greatly improve the safety and reliability of the battery, they can cause the discharge duration estimates calculated by the BMS to be inaccurate since the thermal limit may be reached before the available stored energy of the battery is completely depleted. Furthermore, when batteries are discharged in only a few minutes, discharge duration estimates calculated in minutes do not provide useable information. Hence, there is a need for improved methods and systems for estimating battery discharge time duration during high-rate battery discharging.

BRIEF SUMMARY

Embodiments of the disclosure provide systems and methods for estimating battery discharge time duration that considers both chemical and thermal capacity during high-rate battery discharging. Generally speaking, embodiments of the present disclosure are directed to a prediction of battery run times for short duration, high-current discharge events that are scaled in seconds rather than minutes, and are continuously compensated for changes in temperature including both ambient temperature and cell internal temperature rise resulting from cell self-heating which can alter discharge times as a result of reaching thermal limitations before chemical capacity has actually been exhausted.

According to one embodiment, determining a discharge time duration for a battery can comprise calculating a current-based time to discharge termination for the battery based on an actual amount of current being discharged from the battery. The calculated current-based time to discharge termination for the battery can comprise a number of seconds. A temperature-based time to discharge termination for the battery can also be calculated based on an actual instantaneous temperature of the battery while the battery is being discharged. The calculated temperature-based time to discharge termination for the battery can also comprise a number of seconds. The calculated temperature-based time to discharge termination for the battery can be further based on a real-time measurement of the actual temperature of the battery while the battery is being discharged and a rate of change of the actual temperature of the battery while the battery is being discharged.

The calculated current-based time to discharge termination for the battery can be compared to the calculated temperature-based time to discharge termination for the battery and the discharge time duration for the battery can be determined based on comparing the calculated current-based time to discharge termination for the battery to the calculated temperature-based time to discharge termination for the battery. More specifically, determining the discharge time duration for the battery based on comparing the calculated current-based time to discharge termination for the battery to the calculated temperature-based time to discharge termination for the battery can comprise, in response to determining the current-based time to discharge termination for the battery being greater than the calculated temperature-based time to discharge termination for the battery, setting a value for the discharge time duration to the number of seconds of the temperature-based time to discharge termination for the battery. In response to determining the current-based time to discharge termination for the battery not being greater than the calculated temperature-based time to discharge termination for the battery, a value for the discharge time duration can be set to the number of seconds of the current-based time to discharge termination for the battery. The determined discharge time duration can be provided, e.g., as a fuel gauge or other indication of remaining charge.

According to one embodiment, determining a SOH for the battery can be based at least in part on the actual temperature of the battery while the battery is being discharged and can comprise storing a set of initial change in temperature rise values for the battery. An actual change in temperature rise for the battery can be determined while the battery is being discharged. A ratio between at least one of the stored set of initial change in temperature rise values and the actual change in temperature rise can be determined. Maximum and expected temperatures for the battery can also be determined while the battery is being discharged. A minimum predicted time allowed during discharge can be determined based on the ratio between at least one of the stored set of initial change in temperature rise values and the actual change in temperature rise and the maximum and expected temperatures for the battery while the battery is being discharged. In response to an actual discharge time being less than the minimum predicted time, the battery can be identified as being at End Of Service Life (EOSL).

Figure 1:
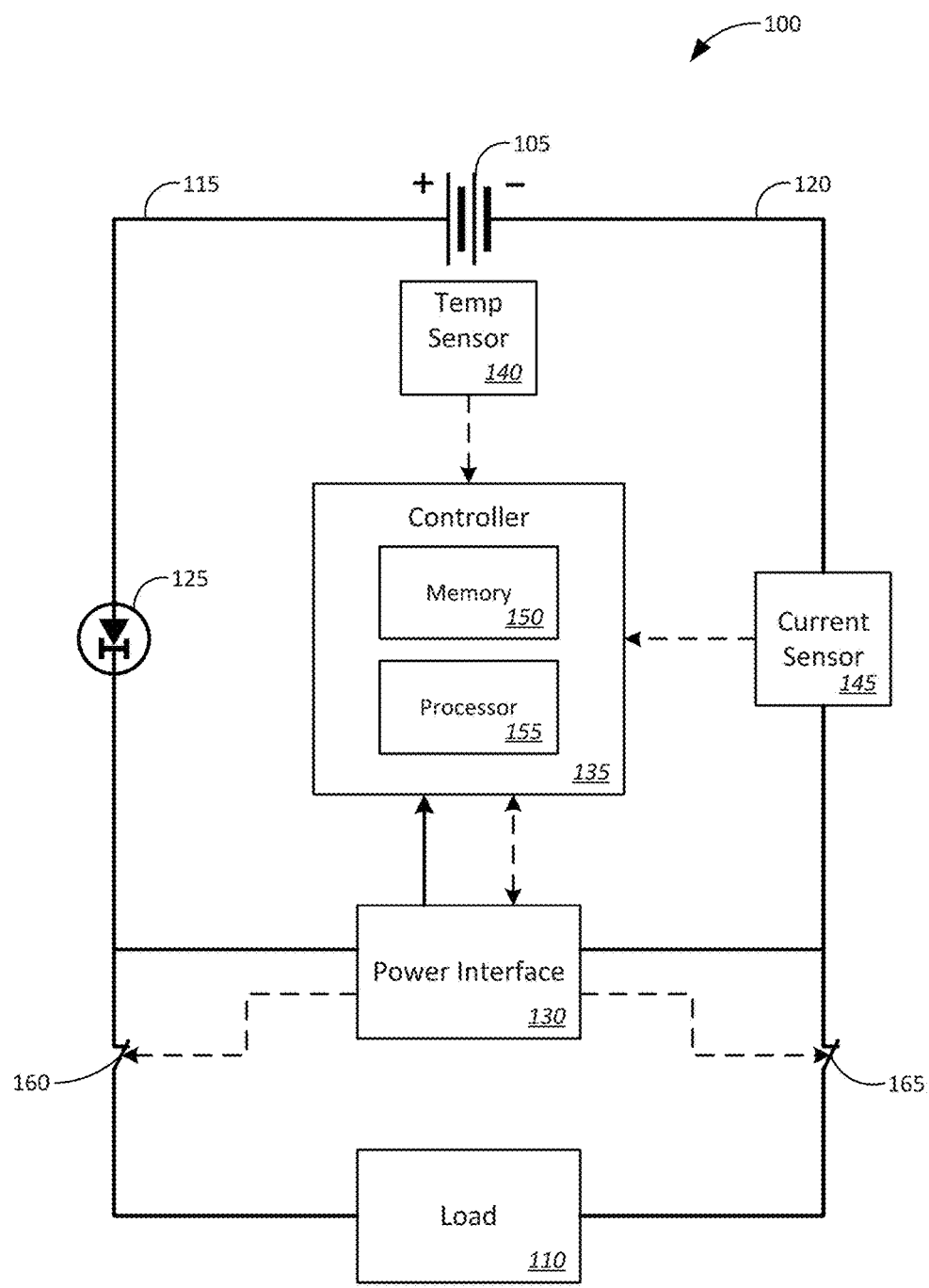
FIG. 1 is a block diagram illustrating a system including a Battery Management System (BMS) implementing battery monitoring and discharge time duration calculation according to one embodiment.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the second reference label.

DETAILED DESCRIPTION

In the following description, for the purposes of explanation, numerous specific details are set forth in order to provide a thorough understanding of various embodiments disclosured herein. It will be apparent, however, to one skilled in the art that various embodiments of the present disclosure may be practiced without some of these specific details. The ensuing description provides exemplary embodiments only, and is not intended to limit the scope or applicability of the disclosure. Furthermore, to avoid unnecessarily obscuring the present disclosure, the preceding description omits a number of known structures and devices. This omission is not to be construed as a limitation of the scopes of the claims. Rather, the ensuing description of the exemplary embodiments will provide those skilled in the art with an enabling description for implementing an exemplary embodiment. It should however be appreciated that the present disclosure may be practiced in a variety of ways beyond the specific detail set forth herein.

It should be appreciated that the aspects, embodiments and/or configurations illustrated herein describe high power battery systems. The various components of the system can include power supplies, power conversion equipment, motor drives, high power mechanical actuators, high power battery systems and combinations thereof. In some embodiments, the high-power battery can deliver power in the event of failure of a power supply or power conversion system when the high-power battery or battery system has the capability to be switched into and out of electrical connection with the power supply or system encompassing the power supply. These high-power batteries where the embodiments of this description can be in service for power backup, vehicle, transportation, power tools, medical equipment and measuring equipment. It will be appreciated from the following description, and for reasons of computational efficiency, that the components of the system can be arranged at any location within a power delivery system without affecting the operation of the system.

While the exemplary aspects, embodiments, and/or configurations illustrated herein show the various components of the system collocated, certain components of the system can be located remotely, at distant portions of a distributed network, such as a LAN and/or the Internet, or within a dedicated system. Thus, it should be appreciated, that the components of the system can be combined in to one or more devices or collocated on a particular node of a distributed network, such as an analog and/or digital telecommunications network, a packet-switch network, or a circuit-switched network. It will be appreciated from the following description, and for reasons of computational efficiency, that the components of the system can be arranged at any location within a distributed network of components without affecting the operation of the system.

Furthermore, it should be appreciated that the various links connecting the elements can be wired or wireless links, or any combination thereof, or any other known or later developed element(s) that is capable of supplying and/or communicating data to and from the connected elements. These wired or wireless links can also be secure links and may be capable of communicating encrypted information. Transmission media used as links, for example, can be any suitable carrier for electrical signals, including coaxial cables, copper wire and fiber optics, and may take the form of acoustic or light waves, such as those generated during radio-wave and infra-red data communications.

As used herein, the phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising," "including," and "having" can be used interchangeably.

The term "automatic" and variations thereof, as used herein, refers to any process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed.

Human input that consents to the performance of the process or operation is not deemed to be "material."

The term "computer-readable medium" as used herein refers to any tangible storage and/or transmission medium that participate in providing instructions to a processor for execution. Such a medium may take many forms, including but not limited to, non-volatile media, volatile media, and transmission media. Non-volatile media includes, for example, NVRAM, or magnetic or optical disks. Volatile media includes dynamic memory, such as main memory. Common forms of computer-readable media include, for example, a floppy disk, a flexible disk, hard disk, magnetic tape, or any other magnetic medium, magneto-optical medium, a CD-ROM, any other optical medium, punch cards, paper tape, any other physical medium with patterns of holes, a RAM, a PROM, and EPROM, a FLASH-EPROM, a solid state medium like a memory card, any other memory chip or cartridge, a carrier wave as described hereinafter, or any other medium from which a computer can read. A digital file attachment to e-mail or other self-contained information archive or set of archives is considered a distribution medium equivalent to a tangible storage medium. When the computer-readable media is configured as a database, it is to be understood that the database may be any type of database, such as relational, hierarchical, object-oriented, and/or the like. Accordingly, the disclosure is considered to include a tangible storage medium or distribution medium and prior art-recognized equivalents and successor media, in which the software implementations of the present disclosure are stored.

A "computer readable signal" medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

The terms "battery", "cell", "battery cell" and variations thereof, as used herein, are used interchangeably and include any type of electrochemical power delivery device.

The terms "capacity", "energy", "stored energy", "chemical capacity" and variations thereof, as used herein, are used interchangeably and describe the fundamental amount of charge contained within a battery and the ability to extract that charge from the battery to provide electrical power and or do work.

The terms "determine," "calculate," and "compute," and variations thereof, as used herein, are used interchangeably and include any type of methodology, process, mathematical operation or technique.

It shall be understood that the term "means" as used herein shall be given its broadest possible interpretation in accordance with 35 U.S.C., Section 112, Paragraph 6. Accordingly, a claim incorporating the term "means" shall cover all structures, materials, or acts set forth herein, and all of the equivalents thereof. Further, the structures, materials or acts and the equivalents thereof shall include all those described in the summary of the disclosure, brief description of the drawings, detailed description, abstract, and claims themselves.

Aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Any combination of one or more computer readable medium(s) may be utilized. The computer readable medium may be a computer readable signal medium or a computer readable storage medium.

The systems and methods of this disclosure can be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as PLD, PLA, FPGA, PAL, special purpose computer, any comparable means, or the like. In general, any device(s) or means capable of implementing the methodology illustrated herein can be used to implement the various aspects of this disclosure. Exemplary hardware that can be used for the disclosed embodiments, configurations, and aspects includes computers, handheld devices, telephones (e.g., cellular, Internet enabled, digital, analog, hybrids, and others), and other hardware known in the art. Some of these devices include processors (e.g., a single or multiple microprocessors), memory, nonvolatile storage, input devices, and output devices. Furthermore, alternative software implementations including, but not limited to, distributed processing or component/object distributed processing, parallel processing, or virtual machine processing can also be constructed to implement the methods described herein.

Examples of the processors as described herein may include, but are not limited to, at least one of Qualcomm® Snapdragon® 800 and 801, Qualcomm® Snapdragon® 610 and 615 with 4G LTE Integration and 64-bit computing, Apple® A7 processor with 64-bit architecture, Apple® M7 motion coprocessors, Samsung® Exynos® series, the Intel® Core™ family of processors, the Intel® Xeon® family of processors, the Intel® Atom™ family of processors, the Intel Itanium® family of processors, Intel® Core® i5-4670K and i7-4770K 22nm Haswell, Intel® Core® i5-3570K 22nm Ivy Bridge, the AMD® FX™ family of processors, AMD® FX-4300, FX-6300, and FX-8350 32nm Vishera, AMD® Kaveri processors, Texas Instruments® Jacinto C6000™ automotive infotainment processors, Texas Instruments® OMAP™ automotive-grade mobile processors, Texas Instruments® MSP430™ processors, ARM® Cortex™-M processors, ARM® Cortex-A and ARM926EJ-S™ processors, Digital Signal Processors of various architectures and available from several sources, and other industry-equivalent processors, and may perform computational functions using any known or future-developed standard, instruction set, libraries, and/or architecture.

In yet another embodiment, the disclosed methods may be readily implemented in conjunction with software using object or object-oriented software development environments that provide portable source code that can be used on a variety of computer or workstation platforms. Alternatively, the disclosed system may be implemented partially or fully in hardware using standard logic circuits or VLSI design. Whether software or hardware is used to implement the systems in accordance with this disclosure is dependent on the speed and/or efficiency requirements of the system, the particular function, and the particular software or hardware systems or microprocessor or microcomputer systems being utilized.

In yet another embodiment, the disclosed methods may be partially implemented in software that can be stored on a storage medium, executed on programmed general-purpose computer with the cooperation of a controller and memory, a special purpose computer, a microprocessor, or the like. In these instances, the systems and methods of this disclosure can be implemented as program embedded on personal computer such as an applet, JAVA® or CGI script, as a resource residing on a server or computer workstation, as a routine embedded in a dedicated measurement system, system component, or the like. The system can also be implemented by physically incorporating the system and/or method into a software and/or hardware system.

Although the present disclosure describes components and functions implemented in the aspects, embodiments, and/or configurations with reference to particular standards and protocols, the aspects, embodiments, and/or configurations are not limited to such standards and protocols. Other similar standards and protocols not mentioned herein are in existence and are considered to be included in the present disclosure. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present disclosure.

Embodiments of the disclosure provide systems and methods for estimating battery discharge times and particularly to estimating battery discharge time duration during high-rate battery discharging. More specifically, embodiments of the present disclosure are directed to a prediction of battery run times for short duration, high-current discharge events that are scaled in seconds rather than minutes, and are continuously compensated for ambient and/or component temperature which can alter discharge times as a result of reaching thermal limitations before chemical capacity has actually been exhausted. Various additional details of embodiments of the present disclosure will be described below with reference to the figures. While the flowcharts will be discussed and illustrated in relation to a particular sequence of events, it should be appreciated that changes, additions, and omissions to this sequence can occur without materially affecting the operation of the disclosed embodiments, configuration, and aspects.

FIG. 1 is a block diagram illustrating a system including a Battery Management System (BMS) implementing battery monitoring and discharge time duration calculation according to one embodiment. Generally speaking, and as illustrated in this example, the system 100 can include a battery 105, e.g., a lithium or other rechargeable battery, providing power to an electrical load 110 through a pair of power conductors 115 and 120 and optional current limiter 125. As will be seen, lines between components representing power, such as power conductors 115 and 120, are illustrated here as bold, solid lines while lines between components representing control signals are illustrated here as dashed lines.

The exemplary system 100 can also include a BMS comprising a power interface 130, controller 135, temperature sensor 140, and current sensor 145. The power interface 130 can draw power from power conductors 115 and 120 to power the controller 135. The controller can include a memory 150 storing firmware or other instructions executable by a processor 155 within the controller 135. The firmware or other instructions in the memory 150, when executed by the processor 155, can cause the controller 135 to manage operation of the battery 105, such as by monitoring the battery 105 through the temperature sensor 140, current sensor 145, and/or other sensors (not shown here) and protecting the battery 105 from operating outside safe ranges by actuating, either directly or through the power interface 130, one or more disconnects 160 and 165 on the power conductors 115 and 120 to disconnect the battery 105 from the load 110.

It should be noted and understood that the components of the BMS as illustrated here, i.e., the power interface 130, controller 135, temperature sensor 140, and current sensor 145, need not be separate physical elements. Rather, such components and the functions thereof can be combined into one or more physical components. In some implementations, the BMS can fabricated as a chipset comprising one or more integrated circuits. Similarly, while not illustrated here for the sake of simplicity and clarity, it should be understood that the BMS can include a number of other sensors and/or components to perform a variety of functions. For example, in addition to the temperature sensor 140 and current sensor 145 the BMS may include sensors to monitor the battery voltage in terms of total voltage, voltages of individual cells, average, minimum and maximum cell voltage, etc. Using a variety of sensors and under control of the firmware of the controller 135, the BMS can protect the battery 105 from a wide range of damaging and/or dangerous conditions including but not limited to over-current, over-voltage (during charging), under-voltage (during discharging), over-temperature, under-temperature, ground fault, etc. Additionally, or alternatively, the controller 135 of the BMS can determine a State Of Charge (SOC) or Depth Of Discharge (DOD), to indicate the charge level of the battery, a State Of Health (SOH) indicating the overall condition of the battery, and/or make a number of other determinations or perform a wide variety of other calculations.

For example, a method for determining remaining operational life of a battery, or a battery SOH, or the instantaneous ability of the battery to perform its intended function can be based on a measurement of present capacity and, at any point in time, a comparison of that capacity to the capacity of the battery when new. Battery capacity is thus used as a direct indicator of battery SOH. The battery capacity is measured using a controlled discharge current followed by integration of current delivered by the battery times the battery terminal voltage. Battery capacity can be calculated as follows:

$$\text{Capacity}(Ah) = \Sigma I_{discharge}(A) * t_{discharge}(h)$$

Or $$\text{Capacity}(Ah) = \int I_{discharge}(A) * dt$$

Where $I_{discharge}$ is the discharge current and $t_{discharge}$ is the discharge duration in hours. The higher the battery capacity, the longer the battery discharge will be for any particular value of constant current. This method thus derives an SOH value based on a drop in capacity due to cell aging or internal changes in cell chemistry, where SOH is calculated as:

$$SOH_{(present)} = \text{Capacity}_{(present)} / \text{Capacity}_{(new)}$$

BMS systems compliant with the Smart Battery System (SBS) specification have a rudimentary means to predict discharge time duration. Commonly known as "time to empty," it provides an estimate of remaining time until the stored electrical charge in the battery is fully depleted. When a battery is depleted of energy any discharge event must be terminated. The calculation for the amount of discharge time remaining are based on a simple calculation using the equation: Remaining Capacity(mAh)/Current (A)=Time (hr). These calculations are also based on instantaneous or average current. The SBS specification defines average current as the "average current over the last 60 seconds." This is acceptable for low rate discharge where a full discharge time is typically measured in hours. These calculations are generally handled by an SBS compliant fuel gauging chip, since this chip has full and up to date access to remaining capacity, current, and average current information.

The SBS specification defines data registers related to time durations (time to discharge termination, average time to discharge termination, time to charge, average time to charge, etc.) to be 16 bits in size, and scaled in minutes, from 0 minutes to 65535 minutes. Generally, there is no option in SBS compliant systems to change the scaling factor for these measurements. This scaling is generally adequate for low to moderate discharge rate devices such as cell phones, laptop computers, etc., but an emerging class of applications has become available that typically operate at very high discharge rates, where the entire capacity of a fully charged battery can be expended over a period of five minutes, or two minutes or even less. For these applications, discharge duration estimates measured in minutes do not provide useable information. Commercially available fuel gauging chipsets that are compliant with the SBS specifications are not capable of estimating discharge time in units other than minutes and the discharge time estimate they do provide will be seriously over stated in high ambient temperature environments such as those that are expected in normal operation of the units.

For high discharge rate applications, e.g., where full discharges occur in under 500 seconds, a more meaningful measurement of remaining discharge time that a user can expect would be presented in seconds of operation, rather than minutes. Because of register definitions contained in the SBS specification, this scaling is not possible to obtain in commonly available BMS chipsets and systems. Additionally, available BMS do not have a means to allow the operating time estimates to be compensated for rapidly increasing temperatures resulting from battery self-heating during high rate discharges, changes to battery internal impedance, or other significant factors related to high-current discharge events.

Accordingly, embodiments disclosed herein provide a runtime estimation procedure that considers both chemical and thermal capacity, provides signal processing to reduce noise, and includes comparative logic calculations to arrive at a reliable and appropriately scaled discharge time estimate in high rate discharge applications. These embodiments can derive, outside of the SBS specification prescribed algorithms, a prediction of battery run times for short duration, high-current discharge events that are scaled in seconds rather than minutes, and are continuously compensated for instantaneously and continuously changing ambient and cell temperature which can alter discharge times as a result of reaching thermal limitations before chemical capacity has actually been exhausted.

These embodiments can be implemented as instructions stored in the memory 150 of the BMS controller 135 and executed by the processor 155 independent of any SBS specification fuel gauge chip or algorithms. These instructions can provide a set of functions to the controller 135 including the ability to choose a different averaging period for output current (e.g., 1 second, 5 seconds, 7 seconds, or another period suited to the application) to match the specific discharge rate and the variability in the discharge current. These functions can change the chemical capacity discharge time calculation scaling from an estimate made in minutes (i.e., remaining capacity in mAh*60/current in mA) to an estimate measured in seconds (i.e., remaining capacity in mAh*3600/current in mA). According to one embodiment, the functions executed by the processor 155 of the controller 135 can apply temperature compensation to reduce the discharge time estimate to the lesser of the chemical capacity or the thermal capacity of the battery 105 where the temperature compensation can be based on real-time measurement of current temperature and rate of change of temperature to predict the time when a maximum temperature is reached. A comparison of the changing chemical capacity and rate of temperature change can be made continuously. Similarly, these calculations can be performed continuously and the results of the calculations can be reported in real-time.

Thus, embodiments of the present disclosure provide an estimate of battery discharge time duration that uses remaining chemical capacity of the battery and a derived average current to compute in real-time an expected discharge duration scaled in seconds, rather than minutes. Embodiments also provide a temperature compensation factor related to the lithium battery cell self-heating. Each of these algorithms can be performed continuously and results can be updated in real-time.

Figure 2:
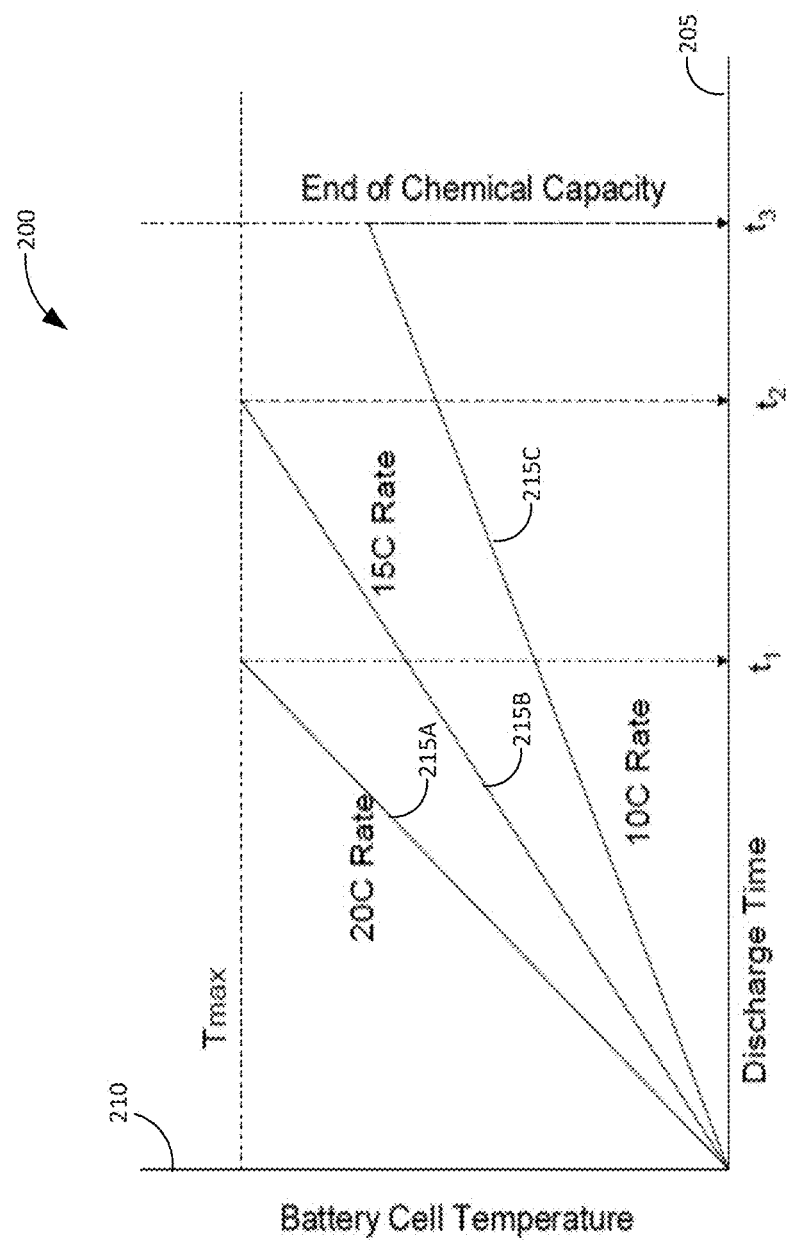
FIG. 2 is a graph illustrating a comparison of battery cell temperature rise as a function of discharge rate according to one embodiment.

FIG. 2 is a graph illustrating a comparison of battery cell temperature rise as a function of discharge rate according to one embodiment. Generally speaking, this graph 200 illustrates that different discharge times are measured if maximum cell operating temperature is reached prior to end of chemical capacity limit. More specifically, this graph 200 represents the battery discharge time along the horizontal axis 205 versus battery cell temperature along the vertical axis 210 and as a function of battery discharge rates 215A-C. In the example of the 10 C discharge rate 215C the battery will exhaust its chemical capacity before its thermal limitation is reached. At the 15 C discharge rate 215B the discharge time (t2) ends upon reaching a fixed temperature limit. This occurs before the battery reaches its chemical capacity limit. At even higher rates such as a 20C discharge rate 215A, the temperature rise can be fast enough to reduce the total discharge duration by a factor of 2 (t1).

Therefore, and according to one embodiment, calculations for the expected duration of any given discharge can be based upon two distinct rates of change. First can be the rate of change of the battery stored energy and second can be the rate of change of the battery temperature during the discharge. The rate of change of battery stored energy can be calculated based on the initial stored energy of the battery at the start of discharge and the time-based integration of current that is being removed from the battery. The maximum stored electrical charge of a battery is related to the chemical capacity of the battery. When fully charged, a battery has a given amount of stored energy which is related to its chemical capacity. When partially charged, the battery also has a specific amount of stored energy, called its instantaneous capacity. The chemical capacity of a battery is dictated by the internal construction and chemistry of the battery as well as the upper charge limit voltage and lower discharge limit voltage. The chemical capacity of the battery can be determined experimentally using electronic measurement equipment and can be represented in Amphere hours (Amp hours or Ah) or milli-Amp hours (mAh). The rate of change of the temperature during the discharge can be measured using thermal measurement devices on the cell.

Current-Based Time to Empty

In a controlled discharge, the discharge duration of the battery can be calculated based on the chemical capacity. The chemical capacity of a battery can be obtained via several methods. For example, battery capacity can be measured directly using a controlled discharge and measuring the actual discharge time. In another example, battery capacity can be calculated based on integrating charge or discharge current as a function of time. The current can be measured during the charge cycle from a "battery depleted" state to a "battery full" state, or during discharge from "battery full" state to a "battery depleted" state of charge. When the battery is depleted of chemical energy it is considered to be "empty". Charge current, by convention, is considered to be a positive (+) current as it adds electrical charge to a battery cell. Discharge current is, by convention, considered a negative (−) current as it removes electrical charge from a battery cell. In some examples, the battery state of charge can be determined and reported by the BMS chipset and software. The calculation of current-based time to empty utilizes, but is independent of, the method used to obtain the instantaneous battery capacity.

The calculation of discharge time for a battery can start with the known instantaneous capacity, or stored energy of the battery. This is represented as the instantaneous capacity ($C_{inst}$) for the given operational state of the battery or battery pack. The instantaneous capacity in Amp-hours can then be converted an instantaneous capacity in Amp-seconds according to:

$$C_{inst}(As) = C_{inst}(Ah) * 3600(S/h)$$

Next, the integrated charge (Q) can be calculated in Coulombs (1C=1 As) according to Ampere's Force Law. The current can be measured at some time interval and the integrated charge can be calculated according to:

$$Q(inst)[As] = [t_2 - t_1](s) * I(A)$$

The sum of the accumulated charge can equal the amount of energy depleted from the battery. When discharge current is detected and the charge integration is started the amount of charge removed from the battery can be measured. For a constant current discharge, the amount of electrical charge depleted can be calculated according to:

$$C_{used}[As] = t_n[s] * I_{act}[A]$$

Where $C_{used}$ is the amount of charge capacity dissipated, $t_n$ is the amount of time of the discharge and $I_{act}$ is the actual measured current of the discharge. For non-constant current discharge events the calculation can be represented by the mathematical integration of current (1) over some time interval according to:

$$C_{used} = \int I \, dt$$

The difference in the total maximum capacity and the used capacity can be the considered the remaining capacity:

$$C_{remain}[As] = C_{max}[As] - C_{used}[As]$$

The remaining capacity can then be used to calculate the amount of discharge time remaining for any given, instantaneous current value:

$$t_{remain}[s] = C_{remain}[As] / I_{act}[A]$$

According to one embodiment, the same process can be used in the opposite direction to accumulate electrical charge for replenishing the battery energy during charging.

Temperature-Based Time to Discharge Termination

The standard practice of charge integration readily accounts for battery capacity during low rate discharges. However, at high rate discharge events greater than 5 C, and especially greater than 8 C, most rechargeable battery cells will exhibit a significant rise in temperature. This temperature rise is based upon power losses due to internal resistance of the cells and the high current being delivered by the cells. The power loss follows the power law and Joule heating, i.e., $P = I^2 R$, where P is the power dissipated per unit time, I is the current, and R is the resistance of the cell. In some cases, the self-heating is so extreme that the discharge event must be terminated to protect the cells or avoid catastrophic cell failures. If the self-heating of the cells creates a rate of temperature rise that is faster than the rate of chemical capacity depletion, the battery will reach its maximum safe operating temperature, forcing discharge to be terminated before it runs out of chemical energy. Embodiments of the present disclosure can calculate the rate of temperature rise and compare that to the rate of energy depletion in order to determine which of the discharge time limiting conditions will occur first. This comparison can be done on time scales approximating real-time using modern electronic measurement and microprocessor technology.

Figure 3:
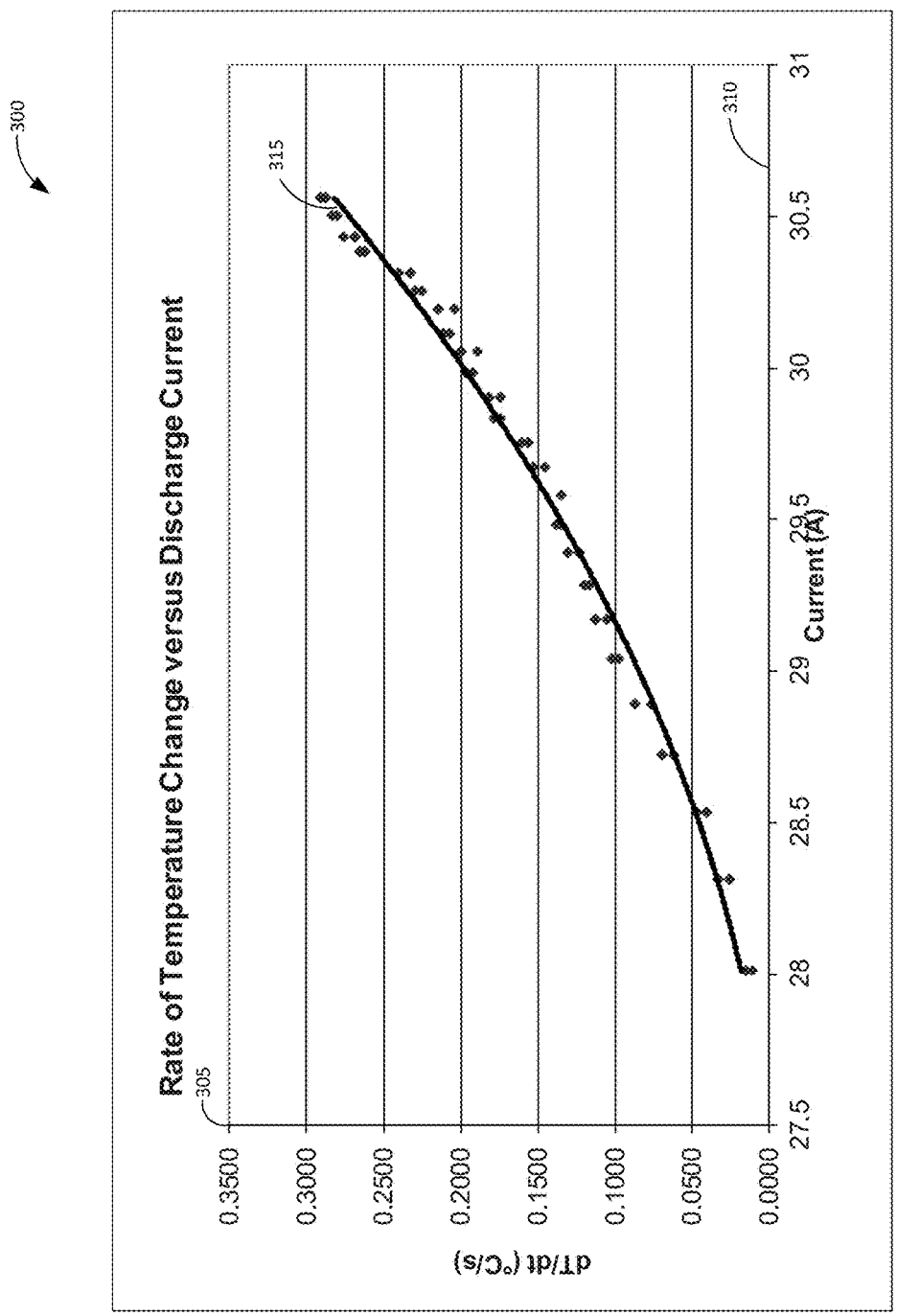
FIG. 3 is a graph illustrating a temperature rise verses current curve according to one embodiment.

FIG. 3 is a graph illustrating a family of temperature rise verses current curves according to one embodiment. The cell temperature rise can be measured using thermal measurement devices on the surface of the cell. As illustrated in this graph 300, the temperature rise rate as a function of time (dT/dt) as illustrated by the vertical axis 305 is relatively constant at discrete current discharge rates as illustrated along the horizontal axis 310 and cell age allowing comparison between runs of controlled conditions.

As a battery ages the internal resistance of the battery increases. As the internal resistance increases the internal temperature rise related to internal power losses and Joule heating are accelerated. Therefore, according to one embodiment, battery SOH can be determined using both dynamic measurement of the cell internal temperature rise caused by the internal cell resistance at a given discharge current and the location on the discharge curve 315.

Every battery also has a terminal voltage curve associated with a particular discharge current. The change in cell temperature rise (ΔT) as well as the rate of change in cell temperature rise (dT/dt) can be measured at different points along the discharge V-I curve corresponding to different SOC. According to one embodiment, records of these changes in temperature can be kept and monitored for change as a function of cycle life and used as metrics for cell aging and overall state of health of the battery. These changes in temperature can be calculated for individual cells or for multiple series cells in a battery assembly, but may be most useful when considered on a cell by cell basis as cells can age at different rates due to differences in manufacturing tolerance or differences in localized ambient temperature in the application.

As noted above, as a battery cell ages its internal resistance increases. This change in resistance is due to internal structural changes in the materials comprising battery anodes and cathodes, chemical changes in the electrolyte, degradations of the electrode coating layers, metal precipitation, changes in diffusion pathways and other chemical, electrical and mechanical mechanisms that change the ability of Lithium ions to travel back and forth from the anode to the cathode during charge and discharge cycles. Because there are changes to internal resistance there is additional heat generated during the discharge cycle that can be directly measured as a change in temperature.

For this reason, changes in cell temperature during discharges can be used as an indicator of cell aging and SOH values can be inferred from changes in cell resistance. Because cell internal resistance values are highly dependent on the chemistry and construction of the cell components, different cells will age at different rates and demonstrate individual changes in cell heating under controlled discharge conditions.

The rate of temperature rise can be compared to some limit. For example, the upper limit of cell temperature can be from 65° C. to 80° C. This limit can be imposed by potential failure of internal components within a battery cell. The maximum allowable discharge temperature can be defined as:

$T_{Limit}$=Discharge Termination Temperature Maximum Limit

Using temperature measurement devices, the temperature of the battery or battery pack can be monitored. This temperature can be represented as:

$T_{act}$=Actual Measured Temperature.

The temperature can be averaged over some time interval to provide some smoothing. The rate of temperature change can be calculated using a first derivative approach. This can be calculated numerically using:

$$dT/dt=(T_{n+x}-T_n)/(t_{m+x}-t_m)[deg/s]$$

Where T is the temperature and t is the time of measurement. Using the rate of rise of the battery pack temperature, a prediction can be made for the amount of time for the battery temperature to reach its maximum limit. The predictive time to reach maximum temperature can be calculated according to:

$$t_{max}[s]=(T_{limit}-T_{act})/[dT/dt]$$

There are multiple ways to determine dT/dt. Each of these examples differs in the amount of processor resources and data memory requirements. In one embodiment, the dT/dt can be measured directly using the time of start of discharge as the initial temperature and time value and then measuring changes in temperature for a given amount of time to determine dT/dt. This calculation can be done real-time provided sufficient processor speed and resource allocation.

In another embodiment, each battery pack system can be calibrated to the temperature rise for its given environment, including ambient temperature and any forced air cooling systems. For example, an automotive battery pack may have limited direct cell cooling. In comparison, a battery unit used for computer system backup power may have direct fan cooling and smaller, overall battery pack size. During system calibration, an accurate Temperature rise versus current curve can be taken. This can be derived from a constant power curve or constant current discharge. A dT/dt value can be calculated (as described above) and plotted versus current as illustrated by the graph 300 of FIG. 3. FIG. 3 illustrates calibration points of rate of temperature change at various discharge currents for a particular battery pack system. Different battery systems will have different rates of temperature change and different discharge currents. These data points can be fit using a non-linear curve based on a power law. The curve can be fit with a quadratic equation:

$$y=Ax^2+Bx+C$$

There are three variables created according to the curve fit. These three calibration variable values can be input or changed in the microcontroller or BMS that is completing the calculations. Once the calibration curve is established the Max current (above, $I_{max}$) can be used to calculate the appropriate dT/dt value for the quadratic equation:

$$dT/dt_{calc}=A*I_{max}^2+B*I_{max}+C$$

The dT/dt can be calculated in real-time depending on the processor speed and resource allocation of the system. In another embodiment, the dT/dt can be predetermined using calibrated measurements that result in a non-linear relationship with current as mentioned above. In this embodiment, the calculations are performed during the programming phase of the system and are stored in data memory as a data array or matrix. This type of array can account for multi-dimensional lookup with multiple variables.

Once dT/dt is determined using any of the aforementioned methods, or combinations thereof, the calculation of temperature based time to discharge termination can be implemented. Using the previous $T_{max}$ threshold (above $T_{limit}$) the temperature rise limit can be calculated for a defined current threshold ($I_{max}$) and this can be used to calculate time remaining:

$$t_{Tmax-remaining}(s)=(T_{limit}-T_{actual})[C]/(dT/dt_{calc})[C/s]$$

Similar equations can be used depending on the starting or background temperature of the battery pack and additional correction factors built into the algorithm.

Comparison

The calculated current-based time to discharge termination can then compared to the temperature-based time to discharge termination and the shorter of the two values can be used to predict the operational time to discharge termination of the battery pack during discharge. In other words, the predicted time to discharge termination can be the lesser of Predicted Temp(max) and Current (max) times. The expected remaining discharge time will be presented in seconds.

Figure 4:
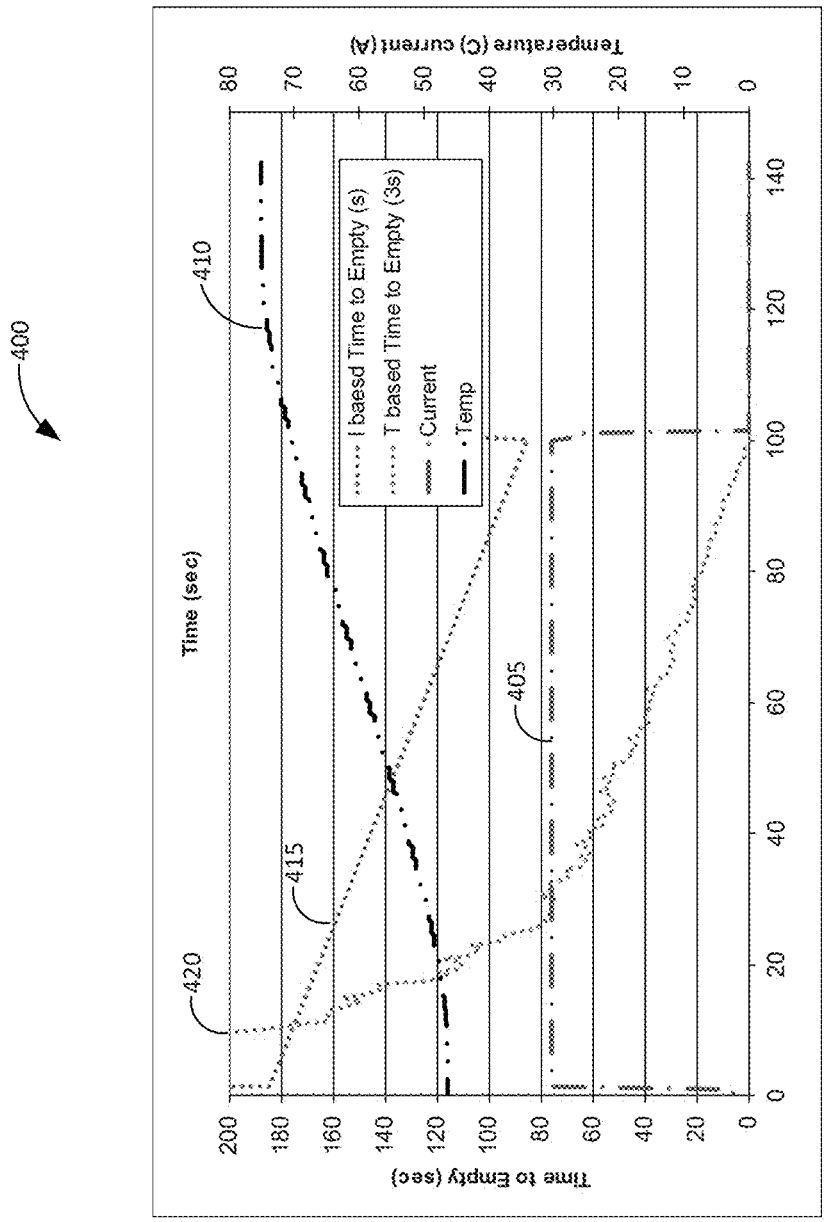
FIG. 4 is a graph illustrating a comparison of current-based and time-based discharge time duration calculations according to one embodiment.
Figure 5:
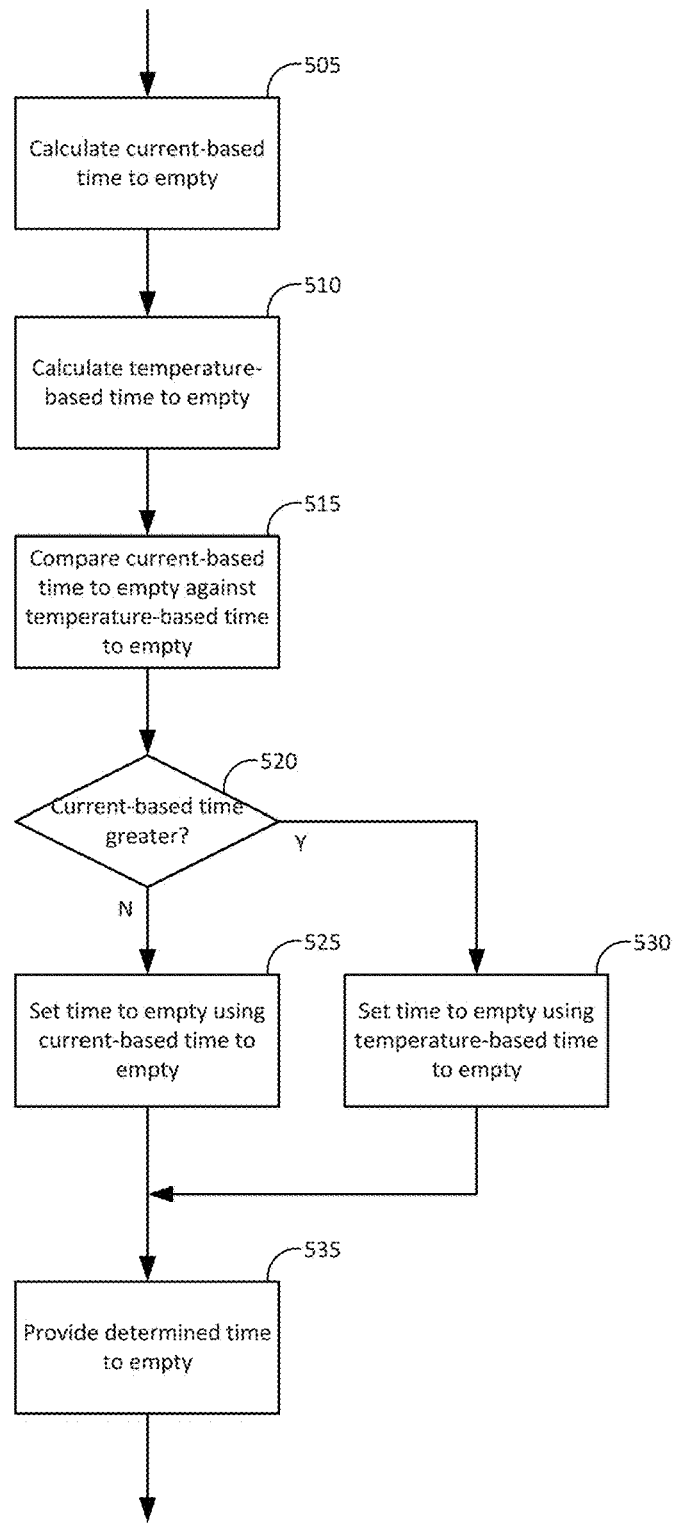
FIG. 5 is a flowchart illustrating an exemplary process for battery monitoring and discharge time duration calculation according to one embodiment.

FIG. 4 is a graph illustrating a comparison of current-based and time-based discharge time duration calculations according to one embodiment. The graph 400 represents an example of a 30 A constant current discharge of a 2000 mAh industry standard 18650 form factor cell represented by current curve 405. The temperature of the cell, represented by temperature curve 410, was monitored at a 1 second interval. The discharge represents a 15 C rate of discharge. The discharge lasts for 103 seconds. The I-based time to discharge termination curve 415 shows approximately 190 seconds of energy based time remaining at the start of discharge. The T-based time to discharge termination curve 420 is based on the rate of temperature rise. The discharge is terminated when the temperature reaches a maximum of 68° C. The current-based calculation of remaining time shows approximately 80 seconds of discharge time remaining. The battery has reached thermal limit before running out of energy. Therefore, in this example, the predictive time to discharge termination should follow the temperature-based curve and not the current-based curve. The logic function for the software would be as follows:

IF [I_Time_to_discharge
        termination>T_time_to_discharge_termination]
        Then [Predicted_Discharge_Time=
        T_time_to_discharge_termination]else
        [Predicted_Discharge_Time=I_time_to_discharge
        termination]Print Predicted_Discharge_Time FIG. 5 is a flowchart illustrating an exemplary process for battery monitoring and discharge time duration calculation according to one embodiment. As illustrated in this example, determining a discharge time duration for a battery can comprise calculating 505 a current-based time to discharge termination for the battery based on an actual amount of current being discharged from the battery. The calculated current-based time to discharge termination for the battery can comprise a number of seconds. A temperature-based time to discharge termination for the battery can also be calculated 510 based on an actual temperature of the battery while the battery is being discharged. The calculated temperature-based time to discharge termination for the battery can also comprise a number of seconds. The calculated temperature-based time to discharge termination for the battery can be further based on a real-time measurement of the actual temperature of the battery while the battery is being discharged and a rate of change of the actual temperature of the battery while the battery is being discharged.

The calculated current-based time to discharge termination for the battery can be compared 515 to the calculated temperature-based time to discharge termination for the battery and the discharge time duration for the battery can be determined based on comparing the calculated current-based time to discharge termination for the battery to the calculated temperature-based time to discharge termination for the battery. More specifically, determining the discharge time duration for the battery based on comparing the calculated current-based time to discharge termination for the battery to the calculated temperature-based time to discharge for the battery can comprise, in response to determining 520 the current-based time to discharge termination for the battery being greater than the calculated temperature-based time to discharge termination for the battery, setting 530 a value for the discharge time duration to the number of seconds of the temperature-based time to discharge termination for the battery. In response to determining 520 the current-based time to discharge termination for the battery not being greater than the calculated temperature-based time to discharge termination for the battery, a value for the discharge time duration can be set 525 to the number of seconds of the current-based time to discharge termination for the battery. The determined discharge time duration Providing 535, e.g., as a fuel gauge or other indication of remaining charge.

State-of-Health Predictions

As part of the process for calculating the change in temperature-based prediction for remaining discharge time the rate of temperature rise (dT/dt) is calculated. As noted above, this rate of temperature rise can be used to determine the SOH of the battery. In high-rate discharges, an increase in cell temperature occurs due to the internal cell impedance also called internal cell resistance. The two most common measurements for internal resistance are the AC Impedance and DC internal resistance (DCIR). AC Impedance is most commonly measured using a one kilo-Hertz (1 kHz) frequency. The DC internal resistance can be obtained using a measurement frequency of 0.1 Hz or less, including a static DC measurement. The DCIR has a greater influence on the rate of temperature rise in a cell during high power discharge. There is a direct correlation between differences in DCIR and dT/dt. Different chemistries of the anode and cathode as well as differences in cell assembly and construction materials, including electrolyte composition, anode and cathode plate alignment as well as separator membrane construction can change the internal resistance. Battery cells can be specifically engineered to have low DCIR. Despite the differences in DCIR all cells will undergo internal chemical changes that manifest an increase in DCIR with increasing cycle life.

The increase in DCIR that results from chemical changes within a battery as it accumulates charge and discharge cycles will also cause an increase in rate of temperature change (dT/dt) during high rate discharges. The changes to dT/dt as the cell ages cause the cell to heat up more rapidly as the cycle count increases. According to one embodiment, the change in temperature rise (dT/dt) can be monitored as a predictive measure of battery cell SOH.

More specifically, in one embodiment, the initial dT/dt can be pre-programmed into the BMS memory. The dT/dt can be programmed as an empirically derived matrix based upon dT/dt and discharge rate. When a battery is discharged during its operational life, the currently measured dT/dt can be compared to the initial dT/dt for a given rate of current in the before mentioned matrix. The ratio of rate of change of dT/dt can be used as a predictive metric for SOH. Knowing the maximum temperature limit and the maximum expected ambient temperature, a prediction of discharge time may be calculated. This can be compared to the minimum time required for a battery to complete its specified discharge function. When the actual discharge time reaches the minimum predicted time, the battery may be considered to have reached the end of its service life. The comparison algorithm described above can be used to predict how long before a battery should be removed from service. This can be used in conjunction with the customary capacity-based SOH measurements.

Figure 6:
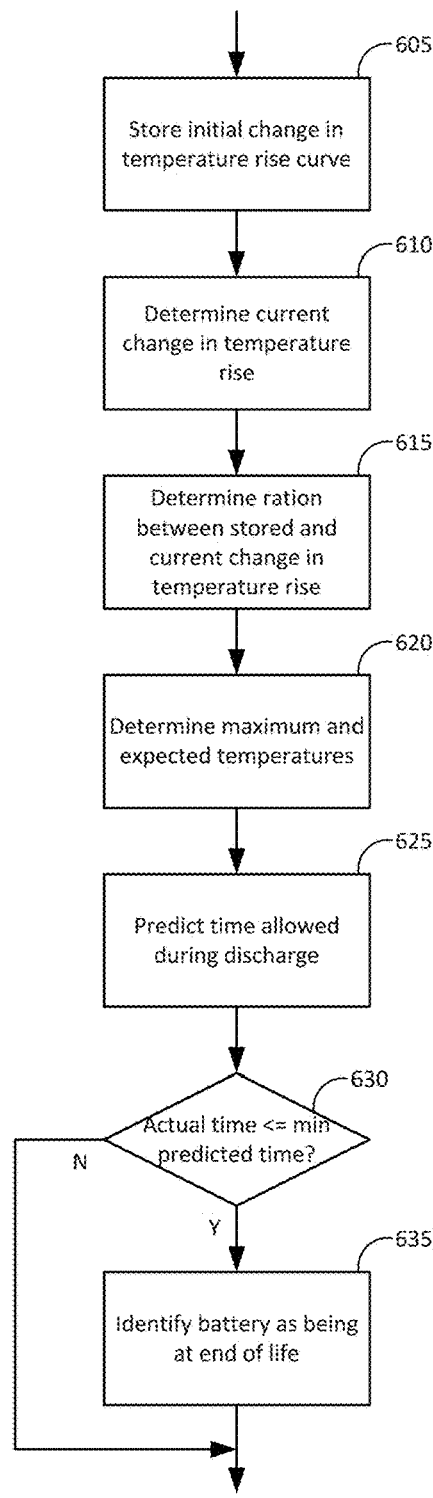
FIG. 6 is a flowchart illustrating an exemplary process for predicting SOH for a battery according to one embodiment.

FIG. 6 is a flowchart illustrating an exemplary process for predicting SOH for a battery according to one embodiment. As illustrated in this example, determining a SOH for the battery can be based at least in part on the actual temperature of the battery while the battery is being discharged and can comprise storing 605 a set of initial change in temperature rise values for the battery. An actual change in temperature rise for the battery can be determined 610 while the battery is being discharged. A ratio between the stored at least one of the stored set of initial change in temperature rise values and the actual change in temperature rise can be determined 615. Maximum and expected temperatures for the battery can also be determined 620 while the battery is being discharged. A minimum predicted time allowed during discharge can be determined based on the ratio between the stored at least one of the stored set of initial change in temperature rise values and the actual change in temperature rise and the maximum and expected temperatures for the battery while the battery is being discharged. In response to an actual discharge time being less than the minimum predicted time, the battery can be identified as being at End Of Service Life (EOSL).

The present disclosure, in various aspects, embodiments, and/or configurations, includes components, methods, processes, systems, and/or apparatus substantially as depicted and described herein, including various aspects, embodiments, configurations embodiments, sub combinations, and/or subsets thereof. Those of skill in the art will understand how to make and use the disclosed aspects, embodiments, and/or configurations after understanding the present disclosure. The present disclosure, in various aspects, embodiments, and/or configurations, includes providing devices and processes in the absence of items not depicted and/or described herein or in various aspects, embodiments, and/or configurations hereof, including in the absence of such items as may have been used in previous devices or processes, e.g., for improving performance, achieving ease and\or reducing cost of implementation.

The foregoing discussion has been presented for purposes of illustration and description. The foregoing is not intended to limit the disclosure to the form or forms disclosed herein. In the foregoing Detailed Description for example, various features of the disclosure are grouped together in one or more aspects, embodiments, and/or configurations for the purpose of streamlining the disclosure. The features of the aspects, embodiments, and/or configurations of the disclosure may be combined in alternate aspects, embodiments, and/or configurations other than those discussed above. This method of disclosure is not to be interpreted as reflecting an intention that the claims require more features than are expressly recited in each claim. Rather, as the following claims reflect, inventive aspects lie in less than all features of a single foregoing disclosed aspect, embodiment, and/or configuration. Thus, the following claims are hereby incorporated into this Detailed Description, with each claim standing on its own as a separate preferred embodiment of the disclosure.

Moreover, though the description has included description of one or more aspects, embodiments, and/or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and/or configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A method for determining a discharge time duration for a battery during a high discharge rate event in which the battery is completely discharged in less than 500 seconds, the method comprising:
   receiving, by a processor of a Battery Management System (BMS), from an electrical current sensing device, an actual, instantaneous amount of current being discharged from the battery;
   calculating, by the processor of the BMS, in real-time, a current-based time to discharge termination for the battery based on a determination of charge stored in a battery at the onset of discharge and the received, actual, instantaneous amount of current being discharged from the battery;
   receiving, by the processor of the BMS, from a temperature sensing device, an actual, instantaneous measurement of temperature of the battery while the battery is being discharged;
   calculating, by the processor of the BMS, in real-time, a temperature-based time to discharge termination for the battery based on the received actual, instantaneous measurement of temperature of the battery while the battery is being discharged;
   comparing, by the processor of the BMS, in real-time, the calculated current-based time to discharge termination for the battery to the calculated temperature-based time to discharge termination for the battery;
   determining, by the processor of the BMS, in real-time, the discharge time duration for the battery based on comparing the calculated current-based time to discharge termination for the battery to the calculated temperature-based time to discharge termination for the battery;
   writing, by the processor of the BMS, in real-time, the determined discharge time duration into a register in a memory of the BMS, wherein the determined discharge time duration written into the memory of the BMS is indicated in seconds; and
   providing, by the processor of the BMS, in real time, a visual representation of the determined discharge time duration indicated in seconds.

2. The method of claim 1, wherein determining the discharge time duration for the battery based on comparing the calculated current-based time to discharge termination for the battery to the calculated temperature-based time to discharge termination for the battery comprises:
   in response to the current-based time to discharge termination for the battery being greater than the calculated temperature-based time to discharge termination for the battery, setting a value for the discharge time duration to the number of seconds of the temperature-based time to discharge termination for the battery; and
   in response to the current-based time to discharge termination for the battery not being greater than the calculated temperature-based time to discharge termination for the battery, setting a value for the discharge time duration to the number of seconds of the current-based time to discharge termination for the battery.

3. The method of claim 1, further comprising determining, by the processor of the BMS, a State Of Health (SOH) for the battery based at least in part on the received actual, instantaneous temperature of the battery while the battery is being discharged.

4. The method of claim 3, wherein determining, by the processor of the BMS, the SOH for the battery further comprises storing a set of initial change in temperature rise values for the battery.

5. The method of claim 4, wherein determining, by the BMS, the SOH for the battery further comprises:
   determining an actual change in temperature rise for the battery while the battery is being discharged;
   determining a ratio between the stored at least one of the stored set of initial change in temperature rise values and the actual change in temperature rise;
   determining maximum and expected temperatures for the battery while the battery is being discharged;
   determining a minimum predicted time allowed during discharge based on the ratio between the at least one of the stored set of initial change in temperature rise values and the actual change in temperature rise and the maximum and expected temperatures for the battery while the battery is being discharged; and
   in response to an actual discharge time being less than the minimum predicted time, identifying the battery as being at End Of Service Life (EOSL).

6. A system comprising:
   a processor; and
   a memory coupled with and readable by the processor and storing therein a set of instructions which, when executed by the processor, causes the processor to determine a discharge time duration for a battery by:
   receiving, from an electrical current sensing device, an actual, instantaneous amount of current being discharged from the battery;
   calculating, in real-time, a current-based time to discharge termination for the battery based on a determination of charge stored in a battery at the onset of discharge and the received, actual, instantaneous amount of current being discharged from the battery;
   receiving, from a temperature sensing device, an actual, instantaneous measurement of temperature of the battery while the battery is being discharged;
   calculating, in real-time, a temperature-based time to discharge termination for the battery based on the received actual, instantaneous measurement of temperature of the battery while the battery is being discharged;

comparing, in real-time, the calculated current-based time to discharge termination for the battery to the calculated temperature-based time to discharge termination for the battery;

determining, in real-time, the discharge time duration for the battery based on comparing the calculated current-based time to discharge termination for the battery to the calculated temperature-based time to discharge termination for the battery;

writing, in real-time, the determined discharge time duration into a register in a memory of the BMS, wherein the determined discharge time duration written into the memory of the BMS is indicated in seconds; and providing, in real time, a visual representation of the determined discharge time duration indicated in seconds.

7. The system of claim 6, wherein determining the discharge time duration for the battery based on comparing the calculated current-based time to discharge termination for the battery to the calculated temperature-based time to discharge termination for the battery comprises:

in response to the current-based time to discharge termination for the battery being greater than the calculated temperature-based time to discharge termination for the battery, setting a value for the discharge time duration to the number of seconds of the temperature-based time to discharge termination for the battery; and in response to the current-based time to discharge termination for the battery not being greater than the calculated temperature-based time to discharge termination for the battery, setting a value for the discharge time duration to the number of seconds of the current-based time to discharge termination for the battery.

8. The system of claim 6, further comprising determining a State Of Health (SOH) for the battery based at least in part on the received actual, instantaneous temperature of the battery while the battery is being discharged.

9. The system of claim 8, wherein determining, by the BMS, the SOH for the battery further comprises storing a set of initial change in temperature rise values for the battery.

10. The system of claim 9, wherein determining the SOH for the battery further comprises:

determining an actual change in temperature rise for the battery while the battery is being discharged;

determining a ratio between the stored at least one of the stored set of initial change in temperature rise values and the actual change in temperature rise;

determining maximum and expected temperatures for the battery while the battery is being discharged;

determining a minimum predicted time allowed during discharge based on the ratio between the stored at least one of the stored set of initial change in temperature rise values and the actual change in temperature rise and the maximum and expected temperatures for the battery while the battery is being discharged; and in response to an actual discharge time being less than the minimum predicted time, identifying the battery as being at End Of Service Life (EOSL).

11. A non-transitory computer-readable medium comprising a set of instructions stored therein which, when executed by a processor, cause the processor to determine a discharge time duration for a battery by:

receiving, from an electrical current sensing device, an actual, instantaneous amount of current being discharged from the battery;

calculating, in real-time, a current-based time to discharge termination for the battery based on a determination of charge stored in a battery at the onset of discharge and the received, actual, instantaneous amount of current being discharged from the battery;

receiving, from a temperature sensing device, an actual, instantaneous measurement of temperature of the battery while the battery is being discharged;

calculating, in real-time, a temperature-based time to discharge termination for the battery based on the received actual, instantaneous measurement of temperature of the battery while the battery is being discharged;

comparing, in real-time, the calculated current-based time to discharge termination for the battery to the calculated temperature-based time to discharge termination for the battery;

determining, in real-time, the discharge time duration for the battery based on comparing the calculated current-based time to discharge termination for the battery to the calculated temperature-based time to discharge termination for the battery;

writing, in real-time, the determined discharge time duration into a register in a memory of the BMS, wherein the determined discharge time duration written into the memory of the BMS is indicated in seconds; and providing, in real time, a visual representation of the determined discharge time duration indicated in seconds.

12. The non-transitory computer-readable medium of claim 11, wherein determining the discharge time duration for the battery based on comparing the calculated current-based time to discharge termination for the battery to the calculated temperature-based time to discharge termination for the battery comprises:

in response to the current-based time to discharge termination for the battery being greater than the calculated temperature-based time to discharge termination for the battery, setting a value for the discharge time duration to the number of seconds of the temperature-based time to discharge termination for the battery; and in response to the current-based time to discharge termination for the battery not being greater than the calculated temperature-based time to discharge termination for the battery, setting a value for the discharge time duration to the number of seconds of the current-based time to discharge termination for the battery.

13. The non-transitory computer-readable medium of claim 11, further comprising determining a State Of Health (SOH) for the battery based at least in part on the received actual, instantaneous temperature of the battery while the battery is being discharged.

14. The non-transitory computer-readable medium of claim 13, wherein determining the SOH for the battery further comprises:

storing a set of initial change in temperature rise values for the battery;

determining an actual change in temperature rise for the battery while the battery is being discharged;

determining a ratio between the stored at least one of the stored set of initial change in temperature rise values and the actual change in temperature rise;

determining maximum and expected temperatures for the battery while the battery is being discharged;

determining a minimum predicted time allowed during discharge based on the ratio between the stored at least one of the stored set of initial change in temperature rise values and the actual change in temperature rise and the maximum and expected temperatures for the battery while the battery is being discharged; and in response to an actual discharge time being less than the minimum predicted time, identifying the battery as being at End Of Service Life (EOSL).

* * * * *